(12) United States Patent
Hoenigschmid

(10) Patent No.: US 6,757,187 B2
(45) Date of Patent: Jun. 29, 2004

(54) INTEGRATED MAGNETORESISTIVE SEMICONDUCTOR MEMORY AND FABRICATION METHOD FOR THE MEMORY

(75) Inventor: Heinz Hoenigschmid, Essex Jct., VT (US)

(73) Assignee: Infineon Technologies AG, Munich (DE)

(*) Notice: Subject to any disclaimer, the term of this patent is extended or adjusted under 35 U.S.C. 154(b) by 248 days.

(21) Appl. No.: 09/997,983

(22) Filed: Nov. 29, 2001

(65) Prior Publication Data

US 2002/0066002 A1 May 30, 2002

(30) Foreign Application Priority Data

Nov. 29, 2000 (DE) .......................... 100 59 181

(51) Int. Cl.[7] ..................... G11C 11/00; G11C 11/15
(52) U.S. Cl. ..................... 365/158; 365/171; 365/173
(58) Field of Search .................. 365/66, 158, 171, 365/173

(56) References Cited

U.S. PATENT DOCUMENTS

| | | | |
|---|---|---|---|
| 5,940,319 A | | 8/1999 | Durlam et al. |
| 5,946,227 A | * | 8/1999 | Naji .......................... 365/158 |
| 6,097,625 A | | 8/2000 | Scheuerlein |
| 6,341,084 B2 | * | 1/2002 | Numata et al. ............. 365/158 |
| 6,421,271 B1 | * | 7/2002 | Gogl et al. ................. 365/158 |
| 6,424,563 B2 | * | 7/2002 | Honigschmid ............. 365/158 |
| 6,490,194 B2 | * | 12/2002 | Hoenigschmid ............ 365/171 |
| 6,555,858 B1 | * | 4/2003 | Jones et al. .................. 365/66 |
| 6,603,677 B2 | * | 8/2003 | Redon et al. ............... 365/171 |

OTHER PUBLICATIONS

M. Durlam et al.: "Nonvolatile RAM based on Magnetic Tunnel Junction Elements", *2000 IEEE International Solid–State Circuits Conference, Digest of Technical Papers*, pp. 130–131.

S. Tehrani et al.: "Recent Devlopments in Magnetic Tunnel Junction MRAM", *IEEE Transactions on Magnetics*, vol. 36, No. 5, Sep. 2000, pp. 2752–2757.

* cited by examiner

*Primary Examiner*—Trong Phan
(74) *Attorney, Agent, or Firm*—Laurence A. Greenberg; Werner H. Stemer; Ralph E. Locher

(57) ABSTRACT

An integrated magnetoresistive semiconductor memory in which each memory cell contains a switching transistor or a diode in the form of an activatable isolating element, and two magnetic layers that are isolated by a thin tunnel barrier. Connecting conductors are respectively integrated for word lines, digit lines and bit lines and also for the purpose of activating the switching transistor in one or more memory cells. These connecting conductors are located in only two metallization planes and in a polysilicon connection plane.

8 Claims, 2 Drawing Sheets

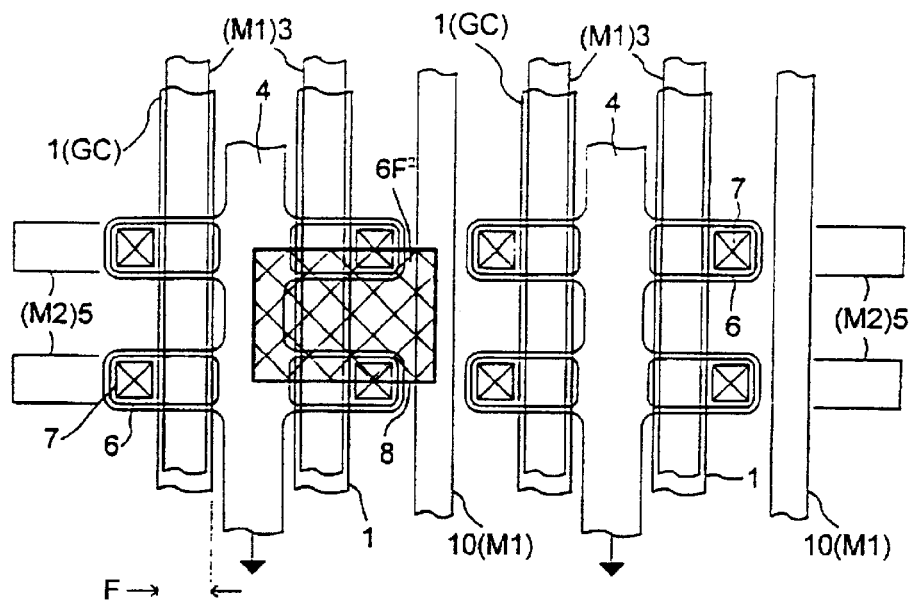
Fig. 3A
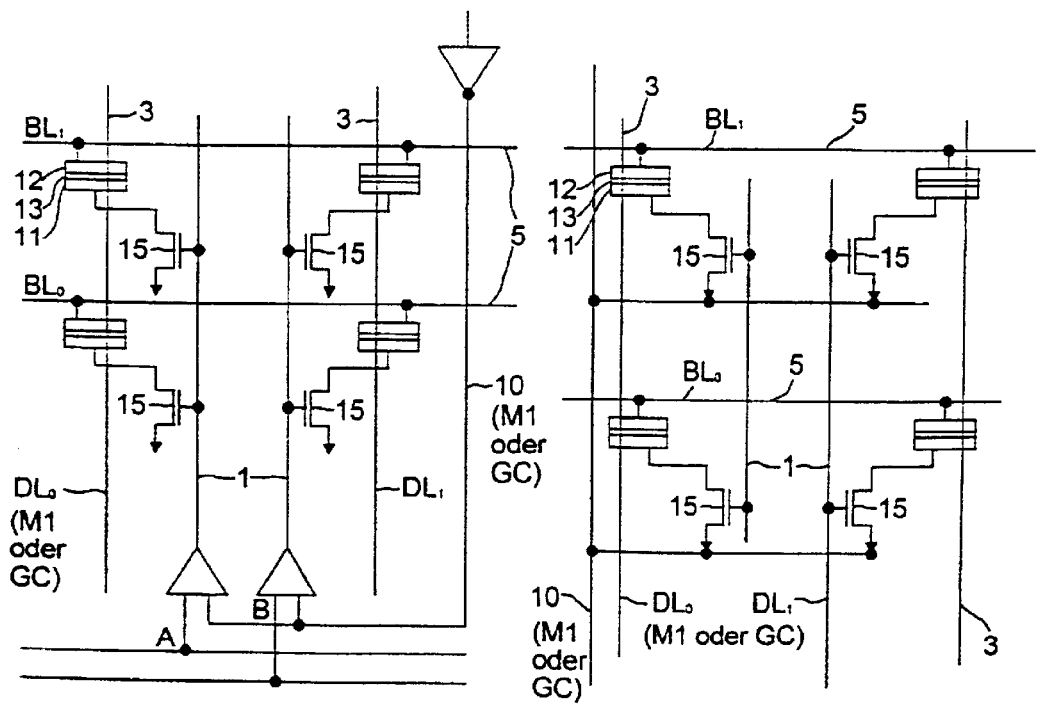
Fig. 3B                    Fig. 4

INTEGRATED MAGNETORESISTIVE SEMICONDUCTOR MEMORY AND FABRICATION METHOD FOR THE MEMORY

BACKGROUND OF THE INVENTION

Field of the Invention

The invention relates to an integrated magnetoresistive semiconductor memory and to an associated fabrication method in which each memory cell contains a switching transistor or a diode in the form of an activatable isolating element, and two magnetic layers that are isolated by a thin tunnel barrier. The memory includes connecting conductors that are respectively integrated for word lines, digit lines and bit lines and also for the purpose of activating the switching transistor in one or more memory cells. The connecting conductors are located in a plurality of metallization planes and in a polysilicon connection plane.

Magnetoresistive semiconductor memory cells (MRAM) are based on magnetic memory components which are integrated together with CMOS (Complementary Metal Oxide Semiconductor) components. The main properties of MRAM technology are that the stored data are nonvolatile and that the memory cells permit an unlimited number of read and write access operations.

Ideally, an MRAM cell would be designed without switching elements, i.e. as a pure resistor matrix. However, this has the crucial drawback that parasitic currents flow away via cells which are not being addressed.

Hence, a known MRAM memory cell shown in FIGS. 1, 2A and 2B uses an activatable MOS transistor to isolate each memory cell and thus achieves a cell structure similar to a DRAM (Dynamic Random Access Semiconductor).

FIG. 1 shows a schematic planar illustration of an exemplary layout for a configuration of 1-transistor MRAM cells.

The actuation for a write and read operation for reading data into and out of an MRAM memory cell is respectively provided by word lines (WL) 1, WL spur lines 2, digit lines 3, and bit lines 5. The reference numeral 4 denotes an active region (diffusion region), 6 denotes a strap section, 7 denotes a contact between the strap section 6 and the diffusion region 4, and 8 denotes a minimally attainable cell layout (shown hatched) of $6F^2$ (F signifies the minimum feature size and is shown in FIG. 1 by the width F of a word line 1, by way of example).

FIG. 2A is a schematic illustration of a cross section through an MRAM memory cell as shown in FIG. 1, and it can be seen clearly that a stack of two magnetic layers 11 and 12 that are isolated by a thin tunnel barrier 13 form a magnetic tunnel junction structure. The magnetic layer 11 forms a fixed magnetic orientation and the magnetic layer 12 forms a floating magnetic orientation. Depending on the relative polarization of the floating magnetic layer 12 with respect to the fixed magnetic layer 11, the resistance of the memory cell is either low or high, and the hysteresis when switching between the two states causes the magnetic storage effect.

The MOS switching transistor 15 integrated in the form of an isolating element effects the bit selection for reading individual bits, and as mentioned, ensures that the stored information does not become transitory as a result of parasitic currents via cells that are not being addressed. FIG. 2A, and in simplified form, FIG. 2B show clearly that the routing of connecting lines, for word lines WL 1, WL spur 2, digit line 3 and bit line 5, requires a polysilicon connection plane GC (Gate Conductor) and three metallization planes M1, M2 and M3. M1 is used, by way of example, to reduce the resistance of the WL (WL spur, WL segmentation), M2 is required for the digit line DL 3 necessary only for writing, and M3 is required for the bit line 5.

It is evident to one of ordinary skill in the art that the large number of metallization and connection planes results in high fabrication costs on account of the complicated process steps required in this regard.

SUMMARY OF THE INVENTION

It is accordingly an object of the invention to provide an integrated magnetoresistive semiconductor memory and a method for producing the memory which overcomes the above-mentioned disadvantages of the prior art apparatus and methods of this general type.

In particular, it is an object of the invention to provide a generic magnetoresistive 1-transistor-cell semiconductor memory and a fabrication method suitable therefore such that the number of metallization planes and hence the process costs are reduced while at the same time the minimum cell layout of $6F^2$ which is achieved in the prior art remains the same. In accordance with one fundamental aspect of the invention, there is provided an integrated magnetoresistive semiconductor memory in which all of the connecting conductors are situated only in two metallization planes and in the polysilicon plane.

With the foregoing and other objects in view there is provided, in accordance with the invention, an integrated magnetoresistive semiconductor memory that includes a plurality of memory cells. Each one of the plurality of the memory cells includes a thin tunnel barrier, two magnetic layers isolated by the tunnel barrier, and an activatable isolating element consisting of a switching transistor. The memory has integrated connecting conductors including word lines, digit lines, bit lines and at least one line for activating the activatable isolating element of at least one of the plurality of the memory cells. The memory has two metallization planes and a polysilicon connection plane. Each one of the connecting conductors is located in one of the two metallization planes or in the polysilicon connection plane.

In accordance with an added feature of the invention, the digit lines and the low resistance word lines are situated in a given one of the two metallization planes.

In accordance with an additional feature of the invention, the connecting conductors that are located in the polysilicon connection plane serve as a substrate short circuit.

With the foregoing and other objects in view there is provided, in accordance with the invention, a method for fabricating an integrated magnetoresistive semiconductor memory, that includes steps of: providing an integrated magnetoresistive semiconductor memory including a plurality of memory cells; for each one of the memory cells, providing two magnetic layers that are isolated by a thin tunnel barrier; for each one of the memory cells, providing an activatable isolating element consisting of a switching transistor; providing the integrated magnetoresistive semiconductor memory with integrated connecting conductors including word lines, digit lines, bit lines and lines for activating the activatable isolating element of each one of the plurality of the memory cells; providing each one of the connecting conductors in a plane selected from the group consisting of two metallization planes and a polysilicon connection plane; providing the digit lines in a given one of the metallization planes; providing first lines in the given one of the metallization planes and in the polysilicon connection plane; and using the first lines, which have not yet been used in a layout of the magnetoresistive semiconductor memory, for connecting other elements of the magnetoresistive semiconductor memory.

In accordance with an added mode of the invention, the given one of the metallization planes is used for the low resistance word lines.

In accordance with additional mode of the invention, the polysilicon connection plane is used as a substrate short circuit.

In accordance with one proposed embodiment of the inventive magnetoresistive semiconductor memory architecture, the same metallization plane, namely M1, is used both for the digit line and for the low-resistance WL connection. The bit line can then be situated in M2.

In another embodiment, the polysilicon connection plane GC is used as a substrate short circuit.

The method for fabricating the integrated magnetoresistive 1-transistor semiconductor memory cell achieves the object described above by inventively using the lines, which have not been used in the layout. These unused lines are situated in the metallization plane for the digit line and in the polysilicon connection plane and are used for other purposes, for example, for the word line WL and the substrate connection.

In accordance with what has been said above, the inventive 1-transistor MRAM architecture can be fabricated using only a few process steps on account of the fact that it uses only two metallization planes and the polysilicon connection plane GC, and it thus helps to reduce process costs. In addition, the minimum cell layout of $6F^2$ can also be retained.

Other features which are considered as characteristic for the invention are set forth in the appended claims.

Although the invention is illustrated and described herein as embodied in an integrated magnetoresistive semiconductor memory and fabrication method therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A shows a planar illustration of a first exemplary embodiment of an inventive integrated magnetoresistive semiconductor memory;

FIG. 3B shows a circuit diagram of the first exemplary embodiment of the integrated magnetoresistive semiconductor memory; and FIG. 4 shows a circuit diagram of a second exemplary embodiment of an inventive integrated magnetoresistive semiconductor memory.

DESCRIPTION OF THE PREFERRED EMBODIMENTS

Figure 1:
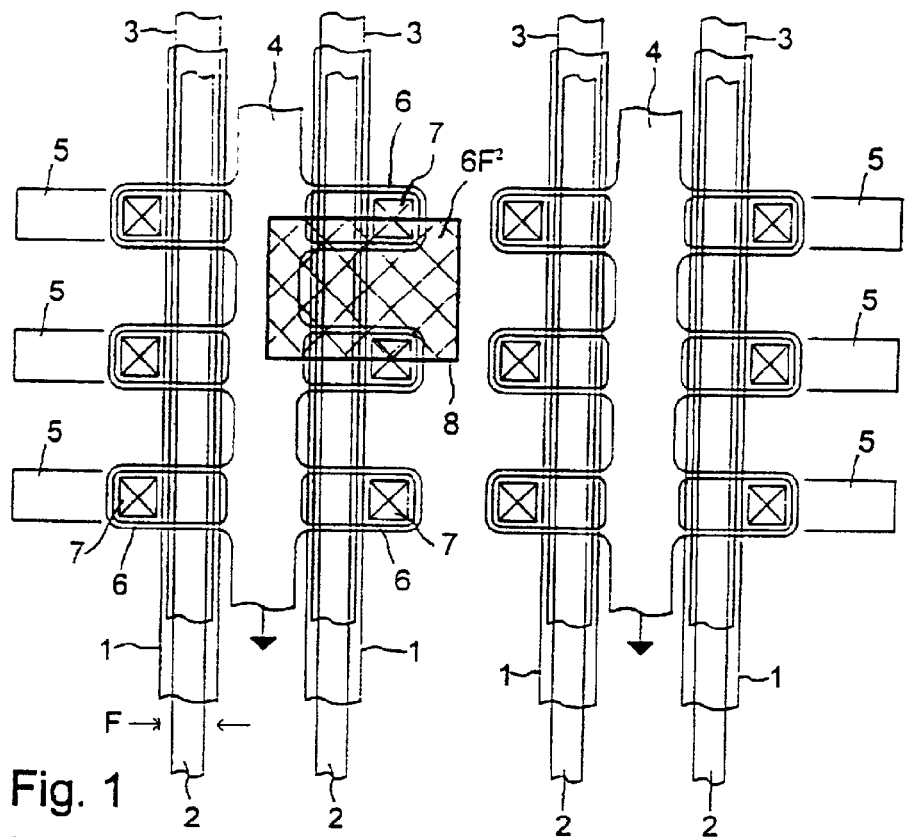
FIG. 1 shows a schematic planar illustration of a layout for a prior art integrated magnetoresistive semiconductor memory.
Figure 2A:
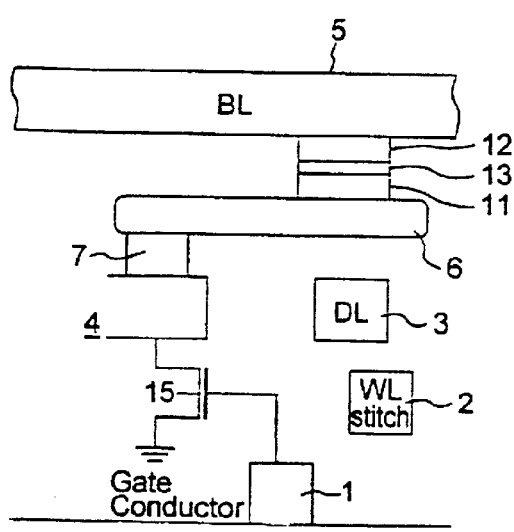
FIGS. 2A and 2B show schematic cross sections of elements, the structure thereof and metallization planes in the prior art integrated magnetoresistive semiconductor memory shown in FIG. 1.
Figure 2B:
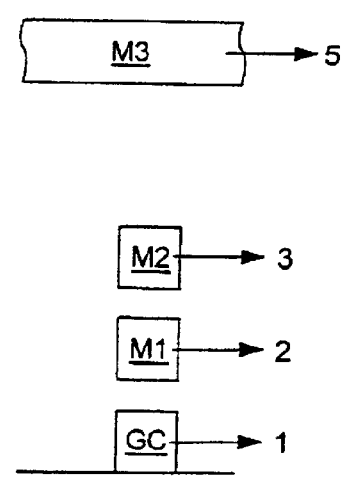

Referring now to the figures of the drawing in detail and first, particularly, to FIG. 3A thereof, there is shown a planar plan view of a first exemplary embodiment of an inventive magnetoresistive 1-transistor semiconductor memory configuration. FIG. 3B shows a circuit diagram of the first exemplary embodiment of the inventive magnetoresistive 1-transistor semiconductor memory configuration. Both the digit line (DL) 3 and the low-resistance word line connections 10 are situated in the metallization plane M1, while the bit lines (BL) 5 are situated in the metallization plane M2. The polysilicon word lines 1 are situated in the polysilicon connection plane GC. In this way, the lines 10 in the metallization plane M1 which are not used in the layout (special purpose line) can be used for quickly activating the word lines by supplying a signal via the lines 10. This can be seen from the circuit diagram shown in FIG. 3B. Alternatively, unused lines situated in the polysilicon connection plane GC may also be used for the same purpose. The minimally attainable cell layout of $6F^2$ is preserved, as indicated by the hatched area 8 in FIG. 3A.

The circuit diagram depicted in FIG. 3B shows the circuit connections of two exemplary digit lines ($DL_0$, $DL_1$)3 with two exemplary bit lines ($BL_0$, $BL_1$)5 via respective magnetoresistive memory cells 11, 12, 13 selected by switching transistors 15 which are activatable by signals on word lines 1. The signals on the respective word line 1 are driven by a respective driver A, B upon activation by supplying a signal via line 10, mentioned above as a low-resistance word line connection (FIG. 3A) and situated in the metallization plane M1, or alternatively in the polysilicon connection plane GC.

FIG. 4 shows a second exemplary embodiment of an inventive integrated magnetoresistive semiconductor memory configuration in which an unused track situated in the M1 metallization plane is used for voltage supply or a track in the polysilicon connection plane GC is used for shorting the transistor 15 to the substrate. It is to be noted that in FIG. 4 the same elements as in FIG. 3B are designated by the same reference signs.

I claim:

1. An integrated magnetoresistive semiconductor memory, comprising:

a plurality of memory cells, each one of said plurality of said memory cells including a thin tunnel barrier, two magnetic layers isolated by said tunnel barrier, and an activatable isolating element formed of a switching transistor;

integrated connecting conductors including word lines, digit lines, bit lines and at least one line for activating said activatable isolating element of at least one of said plurality of said memory cells;

two metallization planes; and a polysilicon connection plane;

each one of said connecting conductors being located in a plane selected from the group consisting of said two metallization planes and said polysilicon connection plane.

2. The integrated magnetoresistive semiconductor memory according to claim 1, wherein said digit lines and said word lines are situated in a given one of said two metallization planes.

3. The integrated magnetoresistive semiconductor memory according to claim 1, wherein said word lines are low-resistance word-lines.

4. The integrated magnetoresistive semiconductor memory according to claim 1, wherein ones of said connecting conductors that are located in said polysilicon connection plane serve as a substrate short circuit.

5. A method for fabricating an integrated magnetoresistive semiconductor memory, which comprises:

provide an integrated magnetoresistive semiconductor memory including a plurality of memory cells;

for each one of the memory cells, providing two magnetic layers that are isolated by a thin tunnel barrier;

for each one of the memory cells, providing an activatable isolating element formed of a switching transistor;

providing the integrated magnetoresistive semiconductor memory with integrated connecting conductors including word lines, digit lines, bit lines and lines for activating the activatable isolating element of each one of the plurality of the memory cells;

providing each one of the connecting conductors in a plane selected from the group consisting of two metallization planes and a polysilicon connection plane;

providing the digit lines in a given one of the metallization planes;

providing first lines in the given one of the metallization planes and in the polysilicon connection plane; and using the first lines, which have not yet been used in a layout of the magnetoresistive semiconductor memory, for connecting other elements of the magnetoresistive semiconductor memory.

6. The fabrication method according to claim 5, which comprises using the given one of the metallization planes for the word lines.

7. The fabrication method according to claim 6, which comprises providing the word lines as low resistance word lines.

8. The fabrication method according to claim 5, which comprises using the polysilicon connection plane as a substrate short circuit.

* * * * *